(12) United States Patent
Liu

(10) Patent No.: US 12,380,939 B2
(45) Date of Patent: Aug. 5, 2025

(54) METHOD AND DEVICE FOR OBTAINING ROW HAMMER REFRESH ADDRESS, AND STORAGE MEDIUM

(71) Applicant: CHANGXIN MEMORY TECHNOLOGIES, INC., Hefei (CN)

(72) Inventor: Lu Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 183 days.

(21) Appl. No.: 18/446,513

(22) Filed: Aug. 9, 2023

(65) Prior Publication Data

US 2024/0055039 A1 Feb. 15, 2024

Related U.S. Application Data

(63) Continuation of application No. PCT/CN2022/123950, filed on Oct. 9, 2022.

(30) Foreign Application Priority Data

Aug. 15, 2022 (CN) .......................... 202210981462.0

(51) Int. Cl.
- *G11C 11/40* (2006.01)
- *G11C 11/406* (2006.01)
- *G11C 11/408* (2006.01)

(52) U.S. Cl.
CPC .. *G11C 11/40618* (2013.01); *G11C 11/40603* (2013.01); *G11C 11/408* (2013.01)

(58) Field of Classification Search
CPC ........ G11C 11/40618; G11C 11/40603; G11C 11/408; G11C 7/1021

See application file for complete search history.

(56) References Cited

U.S. PATENT DOCUMENTS

| 10,790,005 B1* | 9/2020 | He .................. G11C 11/40615 |
| 11,264,079 B1* | 3/2022 | Roberts .................. G11C 7/24 |

(Continued)

FOREIGN PATENT DOCUMENTS

| CN | 206432038 U | 8/2017 |
| CN | 114267390 A | 4/2022 |
| CN | 114446354 A | 5/2022 |

OTHER PUBLICATIONS

Extended European search report in application No. 22922576, mailed on Aug. 6, 2024.

(Continued)

*Primary Examiner* — Han Yang

(74) *Attorney, Agent, or Firm* — Syncoda LLC; Feng Ma

(57) ABSTRACT

A method for obtaining a row hammer refresh address, including: after a row hammer refresh signal arrives, obtaining a current sampling address, and determining whether a high address is locked in a current row hammer refresh cycle; in response to the high address being locked, determining whether a high address of the current sampling address is identical to the locked high address; in response to being identical, updating an access frequency of the locked high address, and updating access frequencies of low addresses with a low address of the current sampling address; and when a next row hammer refresh signal arrives, using a low address with a highest access frequency stored in the group of low registers as a low address of the row hammer refresh address, and using the locked high address as a high address of the row hammer refresh address.

20 Claims, 6 Drawing Sheets

(56) References Cited

U.S. PATENT DOCUMENTS

| | | |
|---|---|---|
| 11,532,336 B2 | 12/2022 | Choi et al. |
| 2020/0211633 A1 | 7/2020 | Okuma |
| 2021/0020223 A1 | 1/2021 | Ayyapureddi et al. |
| 2021/0057013 A1 | 2/2021 | Jenkinson et al. |
| 2021/0158862 A1 | 5/2021 | Okuma |
| 2021/0343324 A1 | 11/2021 | Brown |
| 2022/0084564 A1 | 3/2022 | Choi |
| 2022/0270669 A1 | 8/2022 | Fan |

OTHER PUBLICATIONS

International Search Report in the international application No. PCT/CN2022/123950, mailed on Dec. 27, 2022. 3 pages.

Seyed Mohammad Seyedzadeh et al, "Counter-Based Tree Structure for Row Hammering Mitigation in DRAM," in IEEE Computer Architecture Letters, vol. 16, No. 1, pp. 18-21, Jan. 1-Jun. 2017, doi: 10.1109/LCA.2016.2614497. 4 pages.

Eojin Lee et al, "TWiCe: Time Window Counter Based Row Refresh to Prevent Row-Hammering," in IEEE Computer Architecture Letters, vol. 17, No. 1, pp. 96-99, Jan. 1-Jun. 2018, doi: 10.1109/LCA.2017.2787674. 4 pages.

\* cited by examiner

METHOD AND DEVICE FOR OBTAINING ROW HAMMER REFRESH ADDRESS, AND STORAGE MEDIUM

CROSS-REFERENCE TO RELATED APPLICATIONS

This is a continuation of International Patent Application No. PCT/CN2022/123950, filed on Oct. 9, 2022, which claims priority to Chinese Patent Application No. 202210981462.0, filed on Aug. 15, 2022. The disclosures of International Patent Application No. PCT/CN2022/123950 and Chinese Patent Application No. 202210981462.0 are hereby incorporated by reference in their entireties.

BACKGROUND

In a semiconductor memory, when a word line (WL) corresponding to a certain row address in a storage cell is frequently enabled, it may induce a leakage rate of a capacitor at an adjacent address (generally referred to as "a row hammer address") to be higher than a natural leakage rate, and further result in data loss occurred on the capacitor at the adjacent address due to excessive charge loss before a refresh signal arrives. This situation is generally referred to as a "row hammer effect". In order to suppress the row hammer effect, a timely refresh command needs to be executed on the row hammer address to replenish charges and avoid errors of stored data.

There are usually two ways to obtain the row hammer address, one way is to randomly select a row address as the row hammer address, and the other way is to count each complete row address. Accuracy of the way of randomly selecting the row address is not high, and the way of counting each complete row address is relatively complex, requires a complex circuit structure, and consumes a large chip area.

SUMMARY

The disclosure relates to, but is not limited to a method and device for obtaining a row hammer refresh address, and a non-transitory computer-readable storage medium.

In a first aspect, an embodiment of the disclosure provides a method for obtaining a row hammer refresh address, which includes the following operations.

After a row hammer refresh signal arrives, a current sampling address is obtained, and it is determined whether a high address is locked in a current row hammer refresh cycle.

In response to the high address being locked, it is determined whether a high address of the current sampling address is identical to the high address locked in the current row hammer refresh cycle.

In response to the high address of the current sampling address being identical to the high address locked in the current row hammer refresh cycle, an access frequency of the locked high address is updated, and access frequencies of low addresses stored in a group of low registers are updated with a low address of the current sampling address, herein each of the low addresses corresponds to a respective access frequency.

When a next row hammer refresh signal arrives, a low address with a highest access frequency stored in the group of low registers is used as a low address of the row hammer refresh address, and the locked high address is used as a high address of the row hammer refresh address.

In a second aspect, an embodiment of the disclosure provides a control device for obtaining a row hammer refresh address, which includes a processor, and a memory storing a computer program executable by the processor. The processor is configured to perform the following operations.

After a row hammer refresh signal arrives, a current sampling address is obtained, and it is determined whether a high address is locked in a current row hammer refresh cycle.

In response to the high address being locked, it is determined whether a high address of the current sampling address is identical to the high address locked in the current row hammer refresh cycle.

In response to the high address of the current sampling address being identical to the high address locked in the current row hammer refresh cycle, an access frequency of the locked high address is updated, and access frequencies of low addresses stored in a group of low registers are updated with a low address of the current sampling address, herein each of the low addresses corresponds to a respective access frequency.

When a next row hammer refresh signal arrives, a low address with a highest access frequency stored in the group of low registers is used as a low address of the row hammer refresh address, and the locked high address is used as a high address of the row hammer refresh address.

In a third aspect, an embodiment of the disclosure provides a non-transitory computer-readable storage medium having stored thereon computer executable instructions that, when executed by a processor, cause the processor to perform the following operations.

After a row hammer refresh signal arrives, a current sampling address is obtained, and it is determined whether a high address is locked in a current row hammer refresh cycle.

In response to the high address being locked, it is determined whether a high address of the current sampling address is identical to the high address locked in the current row hammer refresh cycle.

In response to the high address of the current sampling address being identical to the high address locked in the current row hammer refresh cycle, an access frequency of the locked high address is updated, and access frequencies of low addresses stored in a group of low registers are updated with a low address of the current sampling address, herein each of the low addresses corresponds to a respective access frequency.

When a next row hammer refresh signal arrives, a low address with a highest access frequency stored in the group of low registers is used as a low address of the row hammer refresh address, and the locked high address is used as a high address of the row hammer refresh address.

BRIEF DESCRIPTION OF THE DRAWINGS

Here, the drawings are incorporated into the description and constitute a part of the description, show embodiments complying with the disclosure, and are used to explain principles of the disclosure together with the description.

Figure 1:
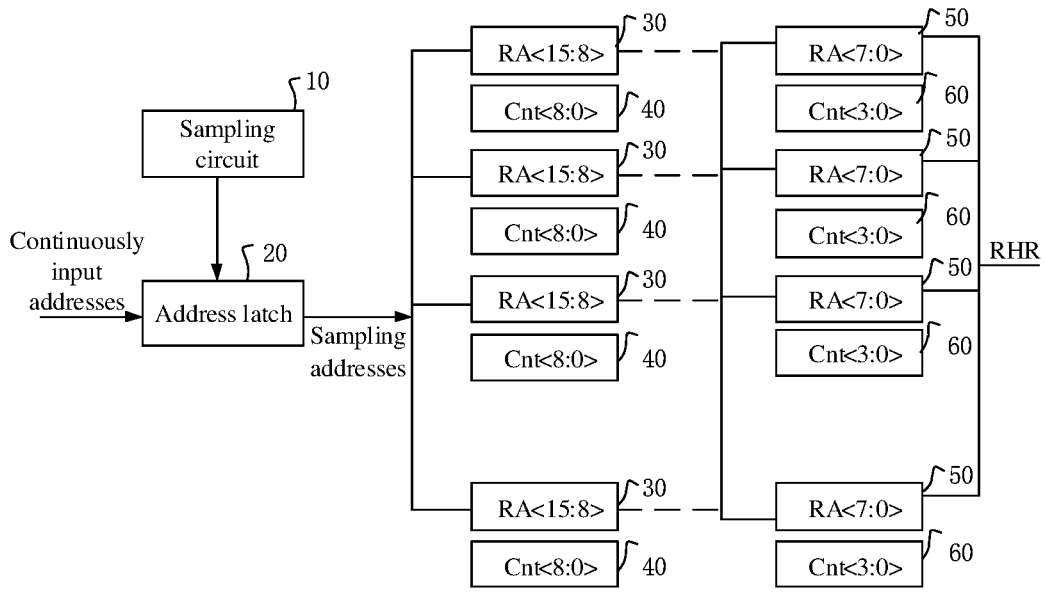
FIG. 1 is a schematic diagram of a semiconductor memory according to an embodiment of the disclosure.

Explicit embodiments of the disclosure have been shown through the above drawings, and more detailed descriptions will be provided later. These drawings and textual descriptions are not intended to limit the scope of the concept of the disclosure in any way, instead, intended to explain the concept of the disclosure to those skilled in the art by referring to specific embodiments.

DETAILED DESCRIPTION

Here, exemplary embodiments will be explained in detail, examples thereof are illustrated in the drawings. When the following descriptions relate to the drawings, the same number in different drawings represents the same or similar elements, unless otherwise indicated. Implementations described in the following exemplary embodiments do not represent all implementations consistent with the disclosure. On the contrary, they are only examples of apparatuses and methods consistent with some aspects of the disclosure as described in detail in the attached claims.

As shown in FIG. 1, an embodiment of the disclosure provides a semiconductor memory, which includes a sampling circuit 10, an address latch 20, high registers 30, low registers 50, and a control device (not shown).

An input end of the address latch 20 continuously receives row addresses, and the sampling circuit 10 is configured to control the address latch 20 to lock the row addresses received by the input end, implement sampling of continuously input row addresses, and output sampling addresses through an output end of the address latch 20.

A group of high registers includes m high registers 30, and each of the high registers 30 is configured to store a high address of a sampling address. Each of the high registers 30 is configured with a counter 40 to record an access frequency of the high address stored in the high register 30.

A group of low registers includes n low registers 50, and each of the low registers 50 is configured to store a low address of a sampling address. Each of the low registers 50 is configured with a counter 60 to record an access frequency of the low address stored in the low register 50.

For example, the row address has a bit number of 16 bits, marked as RA<15:0>. The row address is divided into a high address RA<15:8> and a low address RA<7:0>. The high address refers to the higher 8-bit address in the row address, and the low address refers to the lower 8-bit address in the row address. The high register 30 is configured to store the address RA<15:8>, the counter 40 corresponding to the high register 30 has a count of 9 bits, marked as Cnt<8:0>. The low register 50 is configured to store the address RA<7:0>, the counter 60 corresponding to the low register 50 has a count of 4 bits, marked as Cnt<3:0>.

The control device is configured to implement a method for obtaining a row hammer refresh address described in the following method embodiments.

As shown in FIG. 1, after a row hammer refresh signal arrives, each time the address latch 20 outputs a sampling address, and the high address of the sampling address is sequentially stored in the high register 30. A storage principle is to compare a high address of a current sampling address to address data in all high registers 30 where addresses are stored. When the high address of the current sampling address is identical to the address data in a high register 30, the counter of the corresponding high register 30 is increased by 1. When the high address of the current sampling address is different from the address data in all high registers 30, the high address of the current sampling address is stored in a high register 30 where addresses are not stored. When the high registers 30 are used up, it is determined whether the address data in the high register 30 may be deleted, and then the high address of the current sampling address is stored. An implementation of determining whether the address in the high register 30 may be deleted is described in detail in the following method embodiments and is not explained here. When the address data in the high register 30 cannot be deleted, the current sampling address is discarded. A flag signal or a counter number 0 may be used to represent whether the high registers 30 are used up.

Figure 2:
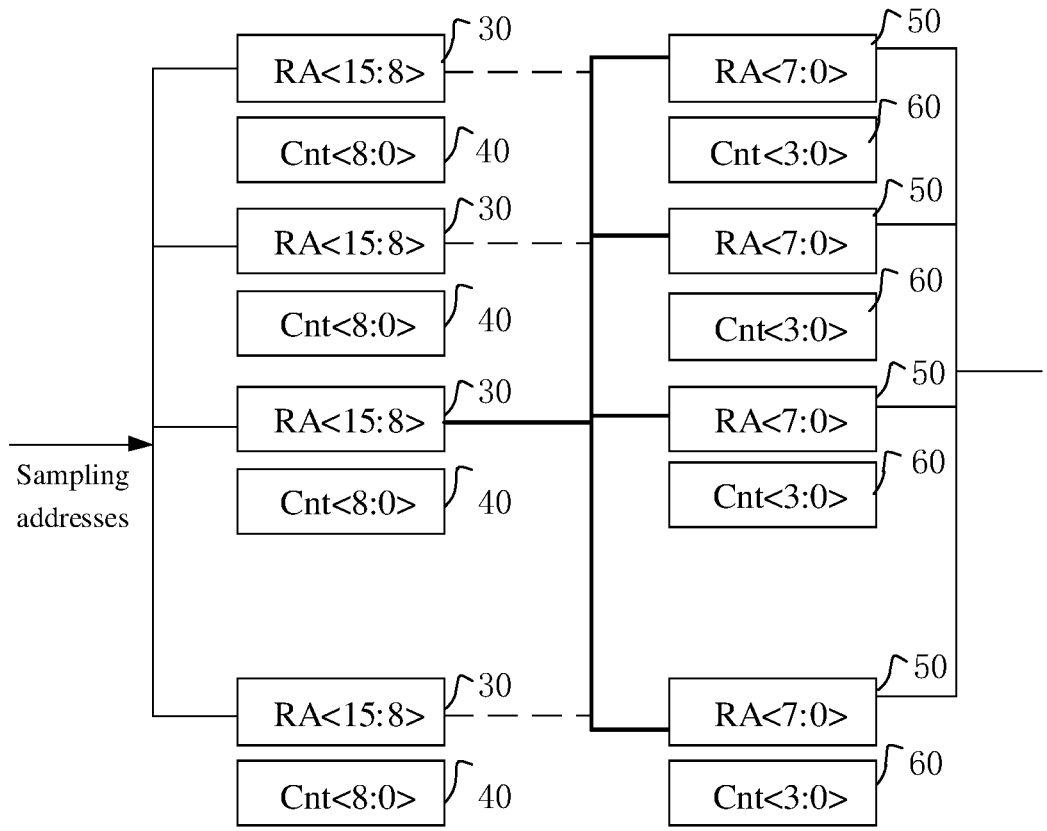
FIG. 2 is a schematic diagram of connecting high registers to low registers according to an embodiment of the disclosure.

As shown in FIG. 2, before a next row hammer refresh signal arrives, when a count value of a counter of a certain high register 30 reaches a first frequency threshold first, the high address stored in the high register 30 is used as a locked high address, and the group of low registers is connected to the high register 30. After connection, the high address of the sampling address is compared to the address data in the high register 30. When the high address of the sampling address is identical to the locked high address, the low address of the sampling address is sequentially stored in the low register 50. When the low address is stored in the low register 50, a storage principle is to compare the low address of the sampling address to a used low register 50. When the low address of the sampling address is identical to the used low register 50, the corresponding counter is increased by 1. When the low address of the sampling address is different from the used low registers 50, the low address of the sampling address is stored in an unused low register 50. When the low registers 50 are used up, the low address of the current sampling address is discarded.

When the next row hammer refresh signal arrives, the locked high address and the low address stored in the low register 50 with a highest counter value are output as the row hammer refresh address.

Figure 3:
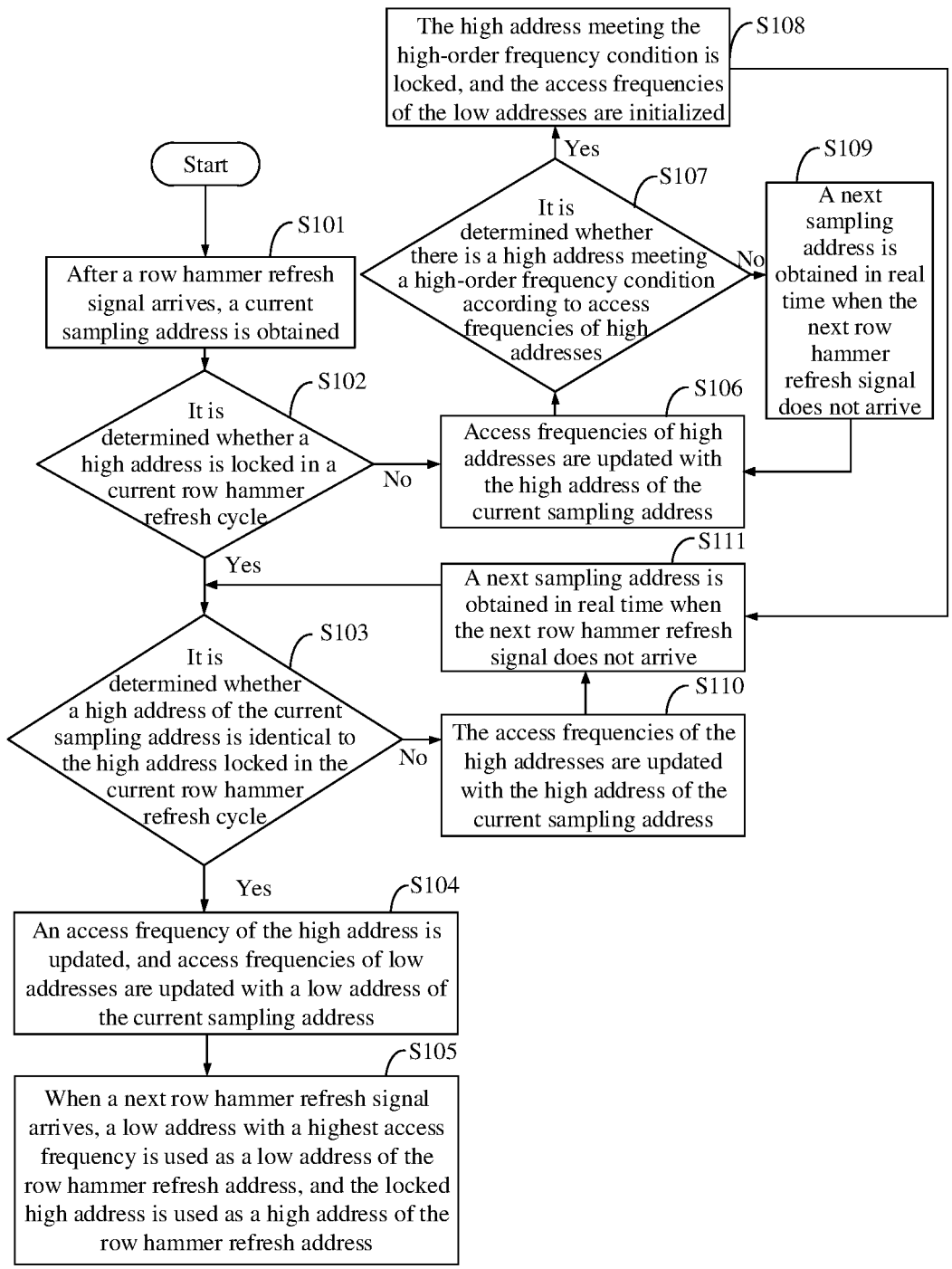
FIG. 3 is a schematic flowchart of a method for obtaining a row hammer refresh address according to an embodiment of the disclosure.

As shown in FIG. 3, an embodiment of the disclosure provides a method for obtaining a row hammer refresh address, the method includes the following operations.

At S101, after a row hammer refresh signal arrives, a current sampling address is obtained.

The row hammer refresh signal is configured to indicate that after a row hammer address is obtained, a word line of a victimized row corresponding to the row hammer address is refreshed.

After the row hammer refresh signal arrives, multiple row addresses are received in sequence and sampled to obtain multiple sampling addresses.

For example, after the row hammer refresh signal arrives, m row addresses are received and sampled to obtain n sampling addresses. The n sampling addresses are sequentially marked as a sampling address 1, a sampling address 2, . . . , and a sampling address n. The current sampling address is a sampling address i, 1<i<n, and i is a positive integer.

At S102, it is determined whether a high address is locked in a current row hammer refresh cycle. The process enters S103 when the high address is locked; otherwise, the process enters S106.

The current row hammer refresh cycle refers to a time period between the row hammer refresh signal and a next row hammer refresh signal.

In general, there is a locked high address in each row hammer refresh cycle, however, a locked time period in each row hammer refresh cycle is different. When there is no locked high address in the row hammer refresh cycle, no row hammer address is generated when the row hammer refresh signal arrives.

The locked high address is a high address meeting a high-order frequency condition first. The high address meeting the high-order frequency condition includes that an access frequency of the high address is greater than or equal to a first frequency threshold. The high address not meeting the high-order frequency condition includes that the access frequency of the high address is less than the first frequency threshold.

First example: at a certain sampling time, addresses and access frequencies of a first high register to a fifth high register are shown in Table 1.

TABLE 1 access frequencies of high addresses in the first example

|  | First high register | Second high register | Third high register | Fourth high register | Fifth high register |
|---|---|---|---|---|---|
| Address | High address 1 | High address 2 | High address 3 | High address 4 | High address 5 |
| Frequency | 10 | 20 | 50 | 30 | 40 |

The first frequency threshold is set to 50, the high address meeting the high-order frequency condition first is the high address 3, the high address 3 is locked in the current row hammer refresh cycle, and the locking time is a time when a counting frequency of the high address 3 is equal to 50.

At S103, it is determined whether a high address of the current sampling address is identical to the high address locked in the current row hammer refresh cycle. The process enters S104 when the high address of the current sampling address is identical to the high address locked in the current row hammer refresh cycle; otherwise, the process enters S110.

The current sampling address is divided into the high address and the low address, and a bit number of the divided high address is identical to a bit number of the high address stored in the high register. The high address of the current sampling address is compared to the high address locked in the current row hammer refresh cycle, to determine whether the two high addresses are the same.

It should be noted that in other embodiments, after division, the bit number of the high address may be different from a bit number of the low address, that is, the bit number of the high address may be less than or greater than the bit number of the low address.

At S104, an access frequency of the locked high address is updated, and access frequencies of low addresses are updated with a low address of the current sampling address.

The operation of updating the access frequencies of the high addresses refers to increasing the access frequency of the locked high address by 1.

The access frequencies of the low addresses are recorded after the high address is locked, so that the row hammer refresh address is determined based on the locked high address and the access frequencies of the low addresses.

The operation of updating the access frequencies of the low addresses with the low address of the current sampling address, specifically includes the following operations. It is determined whether the access frequency of the low address of the current sampling address is recorded. When the access frequency of the low address of the current sampling address is recorded, the access frequency of the low address of the current sampling address is increased by 1. When the access frequency of the low address of the current sampling address is not recorded, it is determined whether there is a storage space to store the low address of the current sampling address. When there is a storage space to store the low address of the current sampling address, the low address of the current sampling address is stored, and the access frequency of the low address of the current sampling address is set to 1.

Explanation is continued with the first example, when the high address of the current sampling address is identical to the high address 3, and an access frequency of the high address 3 at a last sampling time is 104, then the access frequency of the high address 3 is updated to 105.

After the high address 3 is locked, five low addresses and access frequencies are recorded in a first low register to a fifth low register at a current sampling time, as shown in Table 2.

TABLE 2 access frequencies of low addresses in the first example

|  | First low register | Second low register | Third low register | Fourth low register | Fifth low register |
|---|---|---|---|---|---|
| Address | Low address 1 | Low address 2 | Low address 3 | Low address 4 | Low address 5 |
| Frequency | 5 | 8 | 11 | 18 | 12 |

When the low address of the current sampling address is identical to the low address 1, the access frequency of the low address 1 is updated to be 6.

When the low address of the current sampling address is the low address 6, there is no low register 50 to store the low address 6 at present. When there are six low registers and five low registers have been used, there is one idle low register left, and the last idle low register is used to store the low address of the current sampling address. When there are only five low registers, the five low registers have been used, and there is no idle low register, then the low address of the current sampling address is discarded.

At S105, when a next row hammer refresh signal arrives, a low address with a highest access frequency is used as a low address of the row hammer refresh address, and the locked high address is used as a high address of the row hammer refresh address.

When the next row hammer refresh signal arrives, the row hammer address is obtained. The low address with the highest access frequency is used as the low address of the row hammer refresh address, and the locked high address is used as the high address of the row hammer refresh address.

For example, explanation is continued with the first example, the high address locked in the current row hammer refresh cycle is the high address 3, and the access frequency of the low address 4 is highest in access frequencies of five low addresses, then the row hammer refresh address is the high address 3+the low address 4.

In the above technical solutions, the sampling address is divided into the high address and the low address in each row hammer refresh cycle; when it is determined that the high address is locked, it is determined whether the high address of the current sampling address is identical to the locked high address; and when the high address of the current sampling address is identical to the locked high address, the access frequencies of the low addresses are updated with the low address of the current sampling address. According to such configuration, The high address with a high access frequency is locked at an early stage, and the access frequencies of the low addresses are recorded based on the locked high address, and according to such configuration, it is unnecessary to record access frequencies of all sampling addresses, the required circuit structure is simple and consumes a relatively small area. Furthermore, it may achieve by recording access frequencies of the high address and the low address that the row hammer refresh address is accurately captured and a risk of row hammer aggression is reduced.

At S106, in response to no high address being locked in the current row hammer refresh cycle, access frequencies of high addresses are updated with the high address of the current sampling address.

Herein, no high address being locked in the current row hammer refresh cycle, means that none of recorded access frequencies of high addresses meets the high-order frequency condition.

Second example: five high addresses and access frequencies are recorded in the first high register to the fifth high register at the current sampling time, as shown in Table 3.

TABLE 3 access frequencies of high addresses in the second example

|  | First high register | Second high register | Third high register | Fourth high register | Fifth high register |
| --- | --- | --- | --- | --- | --- |
| Address | High address 1 | High address 2 | High address 3 | High address 4 | High address 5 |
| Frequency | 10 | 20 | 48 | 30 | 40 |

The first frequency threshold is set to 50, none of recorded access frequencies of five high addresses meets the high-order frequency condition, and then the access frequencies of the high addresses are updated with the high address of the current sampling address.

The operation of updating the access frequencies of the high addresses with the high address of the current sampling address, specifically includes the following operations. It is determined whether the access frequency of the high address of the current sampling address is recorded. When the access frequency of the high address of the current sampling address is recorded, the access frequency of the high address of the current sampling address is increased by 1. When the access frequency of the high address of the current sampling address is not recorded, it is determined whether there is a storage space to store the high address of the current sampling address. When there is a storage space to store the high address of the current sampling address, the high address of the current sampling address is stored, and the access frequency of the high address of the current sampling address is set to 1. When there is no storage space to store the high address of the current sampling address, it is determined whether a clearing condition of the high address is met. When the clearing condition is met, it continues to determine whether a high address with a lowest access frequency is the locked high address. When the high address with the lowest access frequency is not the locked high address, the high address with the lowest access frequency is deleted, then the high address of the current sampling address is stored, and the access frequency of the high address of the current sampling address is set to 1. When the clearing condition is not met, the high address is discarded.

At S107, it is determined whether there is a high address meeting a high-order frequency condition according to the updated access frequencies of the high addresses. The process enters S108 when there is a high address meeting the high-order frequency condition; otherwise, the process enters S109.

The access frequencies of the high addresses have been updated at S106, and here, it needs to determine whether there is a high address meeting the high-order frequency condition in the updated access frequencies of the high addresses.

At S108, the high address meeting the high-order frequency condition is locked, and the access frequencies of the low addresses are initialized, then the process enters S111.

Since the access frequency of only one high address is updated, there is only one high address meeting the high-order frequency condition. When there is a high address meeting the high-order frequency condition, the high address meeting the high-order frequency condition is directly locked. After the high address is locked, it starts to record the access frequencies of the low addresses. At this point, there are only access records of the low address of the current sampling address, therefore it only needs to set the access frequency of the low address of the current sampling address to 1. After frequency recording of the current sampling address is completed, the process enters S111 since the high address is latched.

At S109, in response to the high address of the current sampling address not meeting the high-order frequency condition, a next sampling address is obtained upon determining that the next row hammer refresh signal does not arrive, and the process returns to S106.

When the high address of the current sampling address does not meet the high-order frequency condition, the next sampling address is obtained upon determining that the next row hammer refresh signal does not arrive, and it continues to perform S106 and S107, until the high address is locked.

That is, after the next sampling address is obtained, the access frequencies of the high addresses are updated with a high address of the next sampling address, and it is determined whether there is a high address meeting the high-order frequency condition according to the updated access frequencies of the high addresses. When there is a high address meeting the high-order frequency condition, the high address is locked; otherwise, it continues to obtain a new next sampling address, the access frequencies of the high addresses are updated with a high address of the next sampling address, and it is determined whether there is a high address meeting the high-order frequency condition according to the updated access frequencies of the high addresses, until the high address is locked.

In the above technical solutions, when it is determined that no high address is locked in a current row hammer cycle, the access frequencies of the high addresses are updated with the high address of the current sampling address, and it is determined whether there is a high address meeting the high-order frequency condition. When there is a high address meeting the high-order frequency condition, the high address is locked. When there is no high address meeting the high-order frequency condition, address sampling is continued, and the access frequencies of the high addresses are updated with the next sampling, until there is a high address meeting the high-order frequency condition. It may achieve by such configuration that the high address is locked, and foundation is laid for recording the access frequencies of the low addresses subsequently.

At S110, in response to the high address of the current sampling address being different from the locked high address, the access frequencies of the high addresses are updated with the high address of the current sampling address.

The operation of updating the access frequencies of the high addresses with the high address of the current sampling address, specifically includes the following operations. It is determined whether the access frequency of the high address of the current sampling address is present in the access frequencies of the high addresses. When the access frequency of the high address of the current sampling address is present, the access frequency of the high address of the current sampling address is increased by 1. When the access frequency of the high address of the current sampling address is not present, it is determined whether there is a storage space to store the high address of the current sampling address. When there is a storage space to store the high address of the current sampling address, the high address of the current sampling address is stored, and the access frequency of the high address of the current sampling address is set to 1. When there is no storage space to store the high address of the current sampling address, it is determined whether a clearing condition is met. When the clearing condition is met, it continues to determine whether a high address with a lowest access frequency is the locked high address. When the high address with the lowest access frequency is not the locked high address, the high address with the lowest access frequency is deleted, then the high address of the current sampling address is stored, and the access frequency of the high address of the current sampling address is set to 1. When the clearing condition is not met, the high address is discarded.

At S111, when it is determined that the next row hammer refresh signal does not arrive, a next sampling address is obtained, and the method returns to S103.

When the high address of the current sampling address is different from the locked high address, the access frequencies of the high addresses are updated with the high address of the current sampling address, and access frequency recording of the current sampling address is completed. When it is determined that the next row hammer refresh signal does not arrive, it continues to obtain a next sampling address, and access frequency recording of the next sampling address is performed. When a high address of the next sampling address is different from the high address locked in the current row hammer refresh cycle, the process enters S110, that is, only an access frequency of the high address of the next sampling address is recorded. When the high address of the next sampling address is identical to the high address locked in the current row hammer refresh cycle, the process enters S104, and the high address and low address of the next sampling address are recorded.

In the above technical solutions, after the high address is locked, the high address of the current sampling address is compared to the locked high address, and access frequencies of the locked high address and the low addresses are updated when the high address of the current sampling address is identical to the locked high address; and only the access frequencies of the high addresses are updated when the high address of the current sampling address is different from the locked high address. It may achieve by such configuration that the access frequency of the low address corresponding to the locked high address is recorded, and when the locked high address is used as the high address of the row hammer refresh address, the low address of the row hammer refresh address is determined according to the access frequencies of the low addresses, which may achieve that the row hammer refresh address is accurately captured and a risk of row hammer aggression is reduced, while it is beneficial to reduce a number of registered access addresses, and reduce usage of registers.

In some embodiments, a semiconductor memory includes a group of low registers and a counter corresponding to each of the low registers. Each of the low registers stores a low address. The counter corresponding to each of the low registers records the access frequency of the low address.

Figure 4:
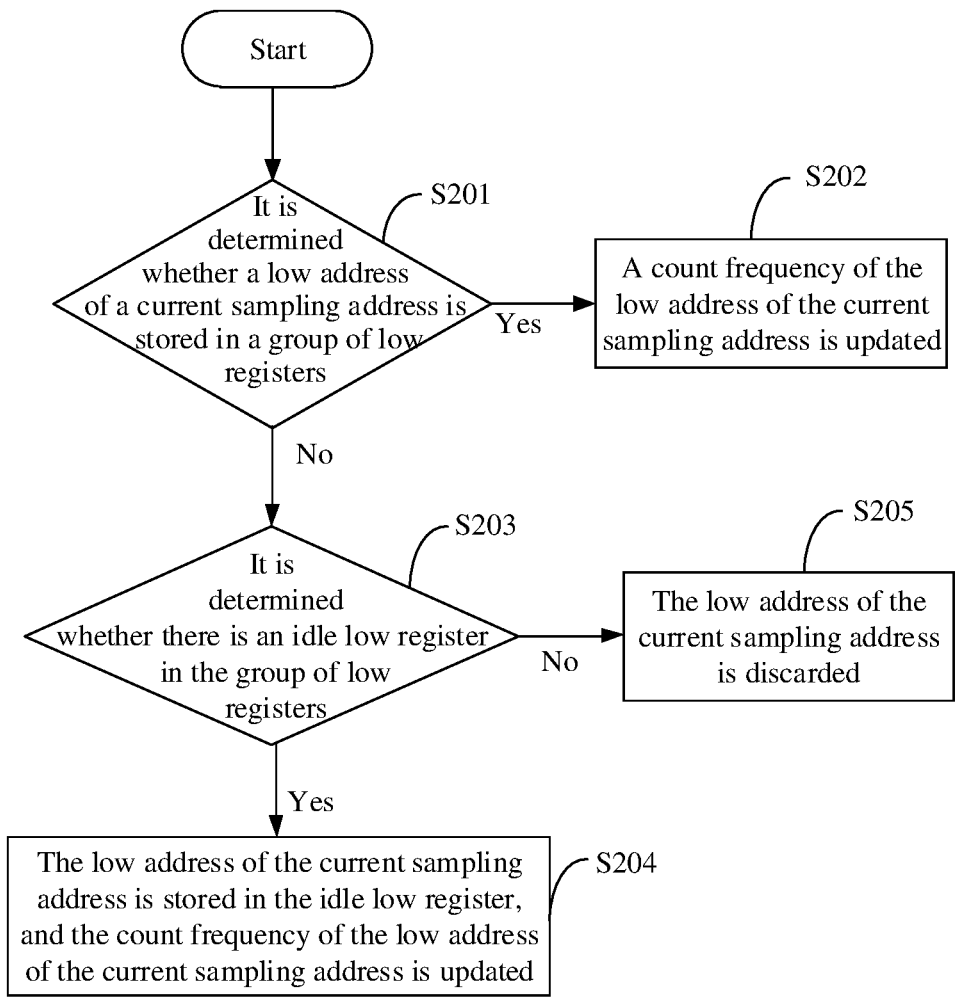
FIG. 4 is a schematic flowchart of updating access frequencies of low addresses according to an embodiment of the disclosure.

As shown in FIG. 4, the operation of updating the access frequencies of the low addresses with the low address of the current sampling address, specifically includes the following operations.

At S201, it is determined whether a low address of a current sampling address is stored in a group of low registers. When the low address of the current sampling address is stored in the group of low registers, the process enters S202; otherwise, the process enters S203.

For a low register storing the low address, it is determined whether the low address stored in the low register is identical to the low address of the current sampling address. When the low address stored in the low register is identical to the low address of the current sampling address, it is determined that the low address of the current sampling address is stored. When the low address stored in the low register is different from the low address of the current sampling address, it is determined that the low address of the current sampling address is not stored.

At S202, in response to the low address of the current sampling address being stored, an access frequency of the low address of the current sampling address is updated.

When it is determined that the low address of the current sampling address is stored, the access frequency of the low address of the current sampling address is directly increased by 1.

At S203, in response to the low address of the current sampling address being not stored, it is determined whether there is an idle low register in the group of low registers.

At S204, in response to there being an idle low register, the low address of the current sampling address is stored in the idle low register, and the access frequency of the low address of the current sampling address is updated.

When there is an idle low register, the low address of the current sampling address is stored in the idle low register, and the access frequency of the low address of the current sampling address is set to 1.

At S205, in response to there being no idle low register, the low address of the current sampling address is discarded.

It should be noted that in some embodiments, in case that a clearing condition is set for the high address, a clearing condition may also be set for the low address part, so that when there are no idle low register, it is determined whether the clearing condition is met first. When the clearing condition is met, a low address with a lowest count value is cleared, and the low address of the current sampling address is stored and counted as 1. It should be noted that the above clearing condition may be achieved by setting a time interval, by setting a number of received sampling addresses, or by setting a total access frequency of registered low addresses.

Specifically, a time window may be set every a period of time, when there is no register available for a new low address in the window, the low address with the lowest count value is deleted, and when the low address is not within the window, the low address may be discarded only. Or, a time window is set every a period of time and may last until no register is available for a new low address so that the low address with the lowest count value needs to be deleted; after the low address with the lowest count value is deleted, a time interval for refreshing the window is recalculated, that is, the above time window is generated after a preset period of time; or, the above time window is set each time a first preset number of sampling addresses are received. It may be understood that the first preset number may be a fixed value, or an incremental value which increases as the received sampling addresses increase. Or, the total access frequency of the low addresses is counted, and the above time window is set every a second preset number of total access frequencies.

Furthermore, a clearing number threshold may also be set. When a number of clearing is equal to the clearing number threshold, the minimum low address is not cleared even though the clearing condition is met, thereby improving data stability.

In some other embodiments, a clearing condition may be set for the high address only, while a clearing condition may not be set for the low address; or, a clearing condition may be set for the low address, while a clearing condition may not be set for the high address, thereby further improving stability and accuracy of the low address or the high address.

In some embodiments, a semiconductor memory includes a group of high registers and a counter corresponding to each of the high registers. Each of the high registers stores a high address. The counter corresponding to each of the high registers records the access frequency of the high address.

Figure 5:
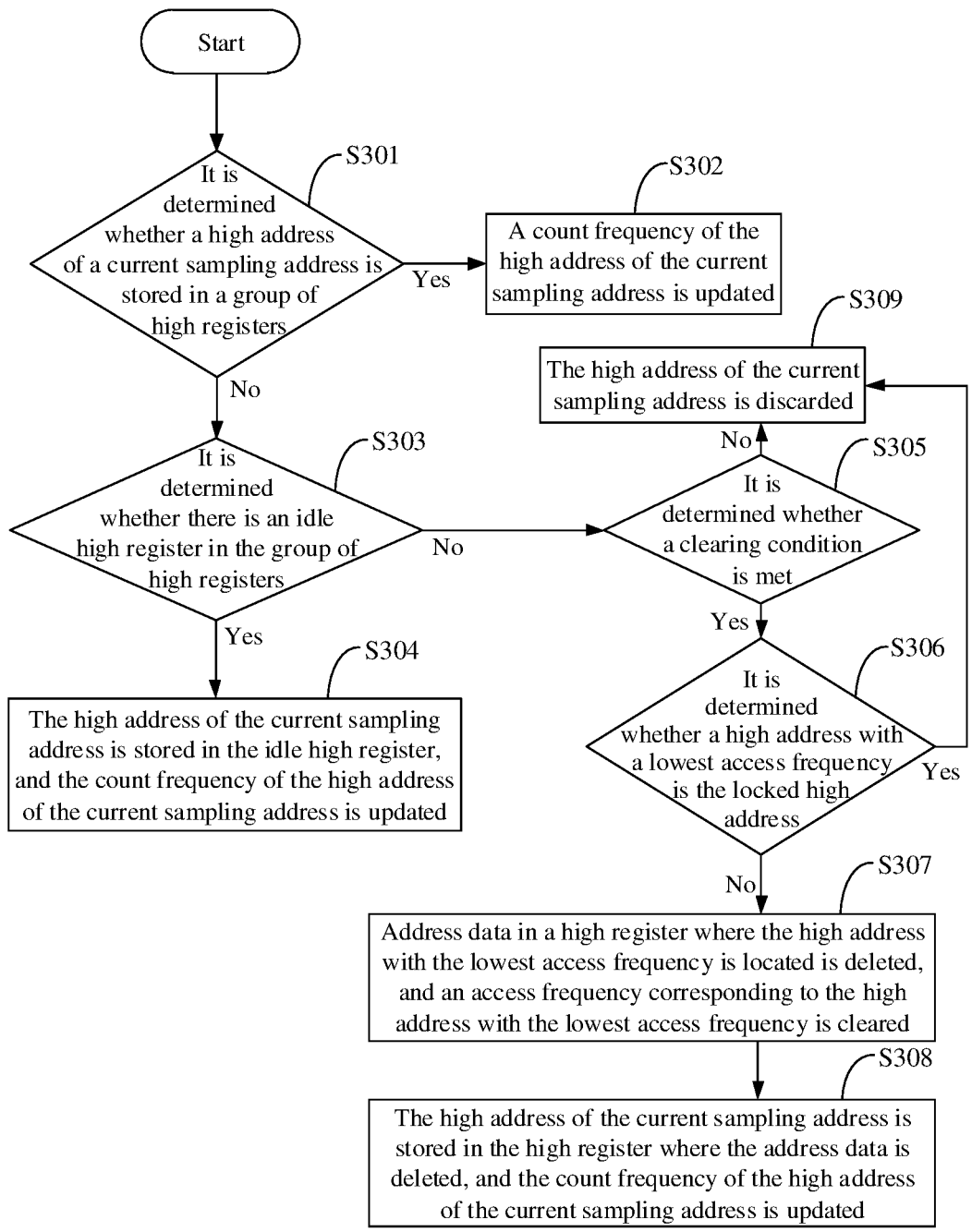
FIG. 5 is a schematic flowchart of updating access frequencies of high addresses according to an embodiment of the disclosure.

As shown in FIG. 5, the operation of updating the access frequencies of the high addresses with the high address of the current sampling address, specifically includes the following operations.

At S301, it is determined whether a high address of a current sampling address is stored in a group of high registers. When the high address of the current sampling address is stored in the group of high registers, the process enters S302; otherwise, the process enters S303.

In case of a high register storing the high address, it is determined whether the high address stored in the high register is identical to the high address of the current sampling address. When the high address stored in the high register is identical to the high address of the current sampling address, it is determined that the high address of the current sampling address is stored. When the high address stored in the high register is different from the high address of the current sampling address, it is determined that the high address of the current sampling address is not stored.

At S302, in response to the high address of the current sampling address being stored, an access frequency of the high address of the current sampling address is updated.

When it is determined that the high address of the current sampling address is stored, the access frequency of the high address of the current sampling address is directly increased by 1.

Third example: five high addresses and access frequencies are recorded in the first high register to the fifth high register at the current sampling time, as shown in Table 4. The high address 3 is locked in the current row hammer refresh cycle.

TABLE 4 access frequencies of high addresses in the third example

|  | First high register | Second high register | Third high register | Fourth high register | Fifth high register |
| --- | --- | --- | --- | --- | --- |
| Address | High address 1 | High address 2 | High address 3 | High address 4 | High address 5 |
| Frequency | 20 | 20 | 56 | 40 | 43 |

When the high address of the current sampling address is identical to the high address 3, the access frequency of the high address 3 is updated to 57.

At S303, in response to the high address of the current sampling address being not stored, it is determined whether there is an idle high register in the group of high registers. When there is an idle high register, the process enters S304; otherwise, the process enters S305.

At S304, in response to there being an idle high register, the high address of the current sampling address is stored in the idle high register, and the access frequency of the high address of the current sampling address is updated.

When there is an idle high register, the high address of the current sampling address is stored in the idle high register, and the access frequency of the high address of the current sampling address is set to 1.

Explanation is continued with the third example, when the high address of the current sampling address is the high address 6, and an access frequency of the high address 6 is not stored at present. When there are six high registers and five high registers have been used, there is one idle high register left, and the last idle high register is used to store the high address of the current sampling address.

At S305, in response to there being no idle high register, it is determined whether a clearing condition is met. When the clearing condition is met, the process enters S306; otherwise, the process enters S309.

In some embodiments, meeting the clearing condition includes that a time length between the current sampling time and a time of a high address with a lowest access frequency in last clearing is greater than or equal to a preset duration threshold. Not meeting the clearing condition includes that the time length between the current sampling time and the time of the high address with the lowest access frequency in last clearing is less than the preset duration threshold.

In some other embodiment, a time window may also be set every a period of time, when there is no register available for a new high address in the window, a high address with a lowest count value is deleted, and when the high address is not within the window, the high address may be discarded only. Or, the above time window is set each time a first preset number of sampling addresses are received. It may be understood that the first preset number may be a fixed value, or an incremental value which increases as the received sampling addresses increase. It may be understood that the time window as expressed above has two forms: one is to last until the high address with the lowest count value is deleted; and the other is a fixed duration, the high address may be discarded only when the fixed duration is missed. In actual control, the time window may be set and selected according to actual requirements.

In some embodiments, meeting the clearing condition includes that a number of executed row hammer refresh operations is greater than or equal to a clearing number threshold. Not meeting the clearing condition includes that the number of executed row hammer refresh operations is less than the clearing number threshold.

At S306, when the clearing condition is met, it is determined whether a high address with a lowest access frequency is the locked high address. When the high address with the lowest access frequency is the locked high address, the process enters S309; otherwise, the process enters S307.

At S307, address data in a high register where the high address with the lowest access frequency is located is deleted, and an access frequency corresponding to the high address with the lowest access frequency is cleared.

In some embodiments, when there are multiple high addresses with the lowest access frequency, and none of the multiple high addresses with the lowest access frequency is the locked high address, a random high address is deleted.

For example, explanation is continued with the third example, each of the high address 1 and the high address 2 has the lowest access frequency, the locked high address is the high address 3, and the high address 1 and the high address 2 are different from the high address 3, then a high register is randomly selected from the first high register and the second high register, and a count frequency of a corresponding counter is cleared. When the first high register is selected, address data in the first high register is deleted, and an access frequency of a counter corresponding to the first high register is cleared.

At S308, the high address of the current sampling address is stored in the high register where the address data is deleted, and the access frequency of the high address of the current sampling address is updated.

When the address data in the first high register is selected to be deleted, the high address of the current sampling address is stored in the first high register, and the access frequency of the counter corresponding to the first high register is set to 1.

At S309, the high address of the current sampling address is discarded.

When the high address of the current sampling address is not recorded, there is no idle low register to store the low address, and the clearing condition is not met, the high address of the current sampling address is discarded. Or, when the high address of the current sampling address is not recorded, there is no idle low register to store the low address, and the clearing condition is met, but the high address with the lowest access frequency is the locked high address, the high address of the current sampling address is discarded.

In the above technical solutions, when the high address of the current sampling address is not recorded, and there is no idle low register to store the low address, it continues to determine whether the clearing condition is met and whether the to-be-cleared high address is the locked high address. When the clearing condition is met and the to-be-cleared high address is not the locked high address, the high address of the current sampling address is stored. According to such configuration, access frequencies of more high addresses may be recorded, to prevent that a high address appeared first occupies storage space all the time, while a high address with a high frequency access appeared later cannot be stored and is not recorded all the time, thereby affecting accuracy of the row hammer address.

In some embodiments, the method for obtaining a row hammer refresh address provided in the disclosure further includes the following operation.

At S112, when row hammer refresh operations of the current row hammer refresh cycle are executed, address data in a high register where a high address with an access frequency less than a second frequency threshold is located is deleted, and an access frequency corresponding to the high address with the access frequency less than the second frequency threshold is cleared.

The second frequency threshold is positively correlated with a number of executed row hammer refresh operations. For example, the second frequency threshold is calculated according to a formula $TH=10*a$, here, a represents a number of executed row hammer refresh operations, and TH represents the second frequency threshold.

When row hammer refresh operations of the current row hammer refresh cycle are executed, the second frequency threshold is updated according to the number of executed row hammer refresh operations. A frequency count of the high address stored in each of the high registers is obtained. The frequency count of each high address is compared to the second frequency threshold. When the frequency count is less than the second frequency threshold, address data in the high register is deleted and an access frequency in a corresponding counter is cleared.

In the above technical solutions, each time a row hammer refresh operation is executed, the address data in the high register with the access frequency less than the second frequency threshold is deleted, access frequencies of more high addresses may be recorded, to prevent that a high address appeared first occupies storage space all the time, while a high address with a high frequency access appeared later cannot be stored and is not recorded all the time, thereby affecting accuracy of the row hammer address. After execution of a row hammer refresh operation is completed, a deletion operation is executed, which may reduce impact of the deletion operation on an accumulative process of access frequencies. Furthermore, the second frequency threshold is set to be positively correlated with the number of executed row hammer refresh operations, to adapt to an increasing frequency of the high address, prevent that usage of a fixed frequency threshold always results in inability to delete high addresses of which the access frequency increases slowly or even does not increase but is higher than the fixed frequency threshold.

In some embodiments, the method for obtaining a row hammer refresh address provided in the disclosure further includes the following operation.

At S113, after row hammer refresh operations of the current row hammer refresh cycle are completed, the low address of the row hammer refresh address stored in a group of low registers is deleted, an access frequency of the low address of the row hammer refresh address is cleared, and the access frequency of the low address of the row hammer refresh address is deducted from an access frequency of the high address of the row hammer refresh address.

Fourth example: five high addresses and access frequencies are recorded in the first high register to the fifth high register, as shown in Table 5. The high address 3 is locked in the current row hammer refresh cycle.

TABLE 5 access frequencies of high addresses in the fourth example

|  | First high register | Second high register | Third high register | Fourth high register | Fifth high register |
|---|---|---|---|---|---|
| Address | High address 1 | High address 2 | High address 3 | High address 4 | High address 5 |
| Frequency | 10 | 20 | 84 | 30 | 43 |

Five low addresses and access frequencies are recorded in the first low register to the fifth low register, as shown in Table 6 sequentially.

TABLE 6 access frequencies of low addresses in the fourth example

|  | First low register | Second low register | Third low register | Fourth low register | Fifth low register |
|---|---|---|---|---|---|
| Address | Low address 1 | Low address 2 | Low address 3 | Low address 4 | Low address 5 |
| Frequency | 4 | 6 | 7 | 9 | 8 |

The row hammer refresh address is selected as the high address 3+the low address 4. After refresh operations are executed on the row hammer refresh address, address data in the fourth low register is deleted, an access frequency of a counter corresponding to the fourth low register is cleared, the access frequency of the low address 4 is deducted from the access frequency of the high address 3, and the updated access frequency of the high address 3 is (84-9)=75.

After impact of the row hammer refresh address is cleared, access frequencies of the high addresses and the low addresses are shown in Table 7 and Table 8 respectively.

TABLE 7 access frequencies of high addresses after a deletion operation is executed in the fourth example

|  | First high register | Second high register | Third high register | Fourth high register | Fifth high register |
|---|---|---|---|---|---|
| Address | High address 1 | High address 2 | High address 3 | High address 4 | High address 5 |
| Frequency | 10 | 20 | 75 | 30 | 43 |

Five low addresses and access frequencies are recorded in the first low register to the fifth low register, as shown in Table 8 sequentially.

TABLE 8 access frequencies of low addresses after a deletion operation is executed in the fourth example

|  | First low register | Second low register | Third low register | Fourth low register | Fifth low register |
|---|---|---|---|---|---|
| Address | Low address 1 | Low address 2 | Low address 3 | Idle | Low address 5 |
| Frequency | 4 | 6 | 7 | — | 8 |

In the above technical solutions, after the row hammer refresh address in the current row hammer refresh cycle is obtained and row hammer refresh operations are executed on the row hammer refresh address, recording of the row hammer refresh address in the access frequency of the high address and the access frequency of the low address is cleared, to prevent the access frequency of the row hammer refresh address from continuing to affect recorded access frequencies of other high and low addresses, resulting in repeated refresh of the row hammer refresh address. By clearing impact of the row hammer refresh address, next acquisition of the row hammer refresh address is prepared.

In some embodiments, the method for obtaining a row hammer refresh address provided in the disclosure further includes the following operation.

At S114, after row hammer refresh operations of the current row hammer refresh cycle are completed, address data in a low register where a low address with an access frequency less than a third frequency threshold is located is deleted, an access frequency of the low address with the access frequency less than the third frequency threshold is cleared, and a total access frequency of the low address with the access frequency less than the third frequency threshold is deducted from the access frequency of the high address locked in the current row hammer refresh cycle.

Explanation is continued with the fourth example, the third frequency threshold is set to 7. Access frequencies in Table 7 and Table 8 are modified. Low addresses with an access frequency less than 7 include the low address 1 and the low address 2. Address data in the first low register and the second low register are deleted, an access frequency of a counter corresponding to the first low register is cleared, and an access frequency of a counter corresponding to the second low register is cleared. The access frequency corresponding to the first low register and the access frequency corresponding to the second low register are deducted from the access frequency of the high address 3, and the access frequency of the high address 3 is updated to (75-(4+6))=65.

In the above technical solutions, after execution of a row hammer refresh operation is completed, low addresses with small access frequencies are deleted, impact of the low address on the access frequency of the high address is cleared, and access frequencies of more low addresses may be recorded, to prevent that a low address appeared first occupies storage space all the time, while a low address with a high frequency access appeared later cannot be stored and is not recorded all the time, thereby affecting accuracy of the row hammer address. After execution of a row hammer refresh operation is completed, a deletion operation is executed, which may reduce impact of the deletion operation on an accumulative process of access frequencies.

Figure 6:
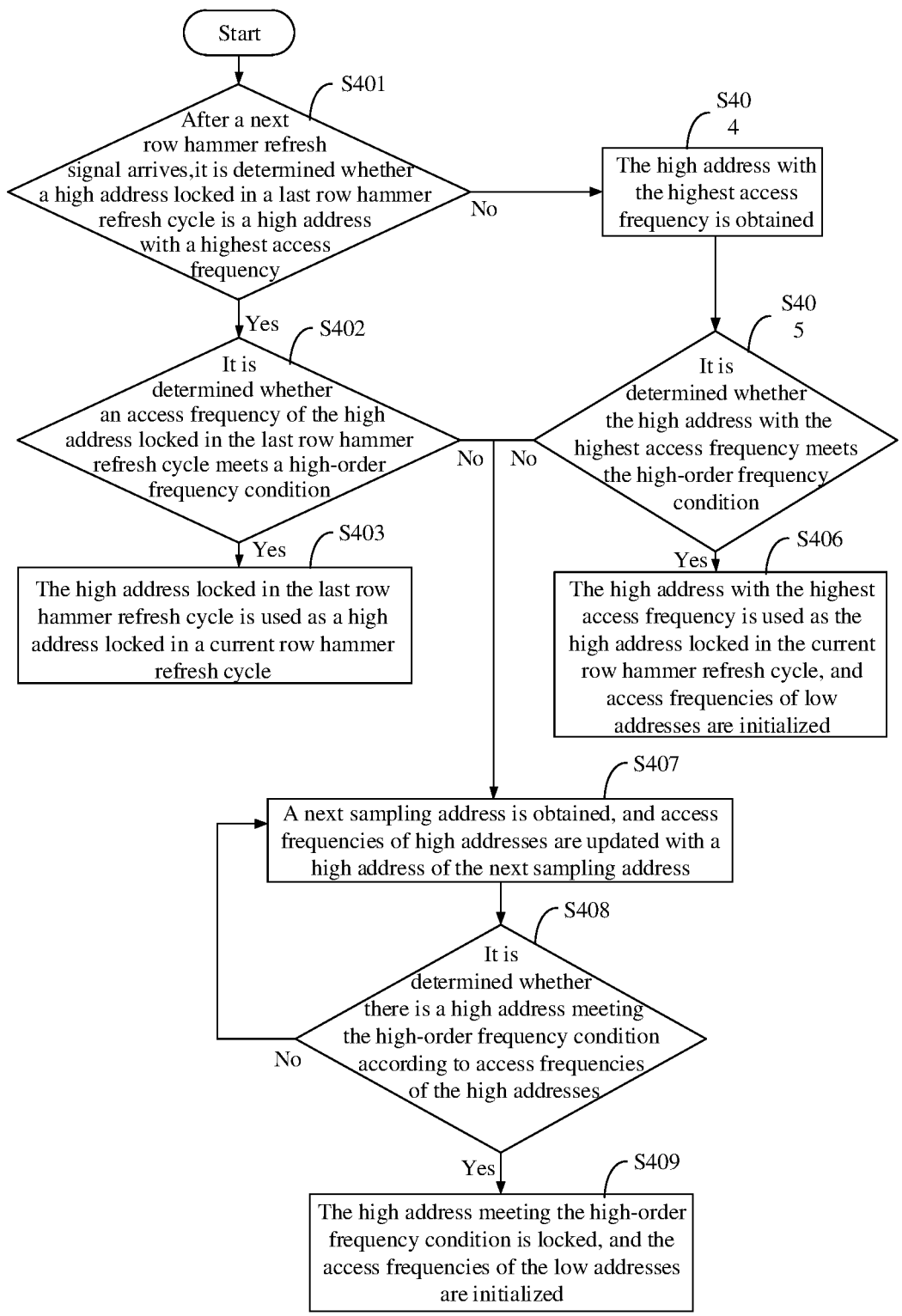
FIG. 6 is a schematic flowchart of locking a high address according to an embodiment of the disclosure.

In some embodiments, as shown in FIG. 6, the method for obtaining a row hammer refresh address provided in the disclosure further includes the following operations.

At S401, after a next row hammer refresh signal arrives, it is determined whether a high address locked in a last row hammer refresh cycle is a high address with a highest access frequency. When the high address locked in the last row hammer refresh cycle is the high address with the highest access frequency, the process enters S402; otherwise, the process enters S404.

There may be one or more high addresses with the highest access frequency. When there is only one high address with the highest access frequency, it is determined whether the high address is the high address locked in the last row hammer refresh cycle. When there are multiple high addresses with the highest access frequency, it is determined whether the high address locked in the last row hammer refresh cycle is present in the multiple high addresses with the highest access frequency.

Explanation is continued with the fourth example, after two deletion operations are executed on access frequencies in Table 5 and Table 6, that is, a deletion operation of eliminating impact of the row hammer refresh address and an operation of deleting the low address with the access frequency less than the third frequency threshold are executed, access frequencies are updated to be shown in Table 9 and Table 10 respectively, and the locked high address is the high address 3.

TABLE 9 access frequencies of high addresses after two deletion operations are executed in the fourth example

|  | First high register | Second high register | Third high register | Fourth high register | Fifth high register |
|---|---|---|---|---|---|
| Address | High address 1 | High address 2 | High address 3 | High address 4 | High address 5 |
| Frequency | 10 | 20 | 65 | 30 | 43 |

TABLE 10 access frequencies of low addresses after two deletion operations are executed in the fourth example

|  | First low register | Second low register | Third low register | Fourth low register | Fifth low register |
|---|---|---|---|---|---|
| Address | Idle | Idle | Low address 3 | Idle | Low address 5 |
| Frequency | — | — | 7 | — | 8 |

In the fourth example, the locked high address has the highest access frequency, and the process skips to S402.

At S402, it is determined whether an access frequency of the high address locked in the last row hammer refresh cycle meets a high-order frequency condition. When the access frequency of the high address locked in the last row hammer refresh cycle meets the high-order frequency condition, the process enters S403; otherwise, the process enters S407.

Meeting the high-order frequency condition includes that the access frequency of the high address is greater than or equal to the first frequency threshold.

At S403, the high address locked in the last row hammer refresh cycle is used as a high address locked in a current row hammer refresh cycle.

When it is determined that the high address locked in the last row hammer refresh cycle still has the highest access frequency in the current row hammer refresh cycle, and also meets the high-order frequency condition, it continues to use the high address locked in the last row hammer refresh cycle.

Explanation is continued with the fourth example, the high address 3 locked in the last row hammer refresh cycle still meets the high-order frequency condition, it continues to use the high address 3 as the high address locked in the current row hammer refresh cycle.

At S404, the high address with the highest access frequency is obtained.

There may be one or more high addresses with the highest access frequency. When there are multiple high addresses with the highest access frequency, one of the high addresses is selected according to a sequence of appearing times of the high addresses. A high address appeared first may be selected, or a high address appeared later may be selected. It is determined whether the access address of the high address meets the high-order frequency condition. When the access address of the high address meets the high-order frequency condition, the high address will be locked.

At S405, it is determined whether the high address with the highest access frequency meets the high-order frequency condition. When the high address with the highest access frequency meets the high-order frequency condition, the process enters S406; otherwise, the process enters S407.

At S406, the high address with the highest access frequency is used as the high address locked in the current row hammer refresh cycle, and access frequencies of low addresses are initialized.

Initialization of the access frequencies of the low addresses refers to clearing previous low addresses and access frequencies of the low addresses.

At S407, a next sampling address is obtained, and access frequencies of high addresses are updated with a high address of the next sampling address.

Updating of the access frequencies of the high addresses has been described in detail in S301 to S309, and is not elaborated here.

At S408, it is determined whether there is a high address meeting the high-order frequency condition according to the access frequencies of the high addresses. When there is a high address meeting the high-order frequency condition, the process enters S409; otherwise, the process enters S407.

At S409, the high address meeting the high-order frequency condition is locked, and the access frequencies of the low addresses are initialized.

Initialization of the access frequencies of the low addresses refers to clearing previous low addresses and access frequencies of the low addresses, recording the low address of the next sampling address, and setting the access frequency to 1.

In the above solutions, after the next row hammer refresh signal arrives, the high address needs to be locked again. When there are multiple high addresses meeting the high-order frequency condition, while access frequencies of the multiple high addresses meeting the high-order frequency condition are different, then the high address with the highest access frequency is selected as the locked high address. When the high address locked in the last row hammer refresh cycle meets the high-order frequency condition and also has the highest access frequency, it may continue to select the high address. According to such configuration, the high address with the highest access frequency may be locked, to prepare determination of the row hammer refresh address.

It may be understood that in the above process of locking the high address, when there is no access frequency of a high address reaches the access frequency in the row hammer refresh cycle all the time, then the row hammer refresh may not be executed when a subsequent row hammer refresh signal arrives; or, after the next row hammer refresh signal arrives, the high address with the highest access frequency from access frequencies updated in the last row hammer refresh cycle (access frequencies of the high addresses and the low addresses are updated, for example, as described above, the access frequency of the high address 3 is 65 and the access frequency of the low address 3 is 7, which are updated access frequencies) is directly locked as the locked address. When there are multiple high addresses with the same access frequency which is the highest access frequency, it is determined whether the multiple high addresses contain the locked address from the last cycle. When the multiple high addresses contain the locked address from the last cycle, the locked address from the last cycle is used as the high locked address for the present cycle. When the multiple high addresses do not contain the locked address from the last cycle, a high address is randomly selected as the high locked address; or, the high address reaching the access frequency first is selected as the locked address; or, without determining whether the multiple high addresses contain the locked address from the last cycle, a high address is randomly selected as the locked address directly, or, the high address reaching a current access frequency first is directly selected as the locked address.

Figure 7:
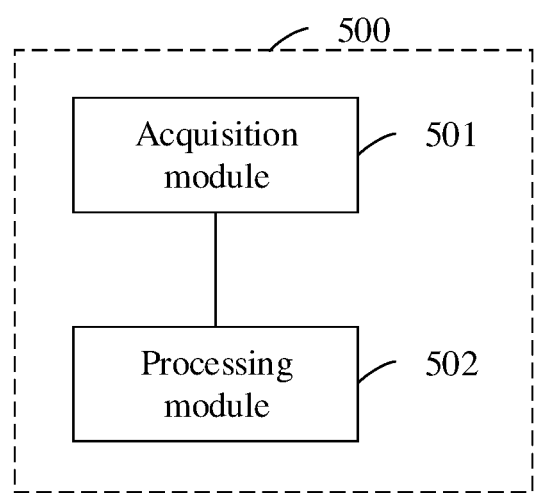
FIG. 7 is a schematic diagram of an apparatus for obtaining a row hammer refresh address according to an embodiment of the disclosure.

As shown in FIG. 7, an embodiment of the disclosure provides an apparatus for obtaining a row hammer refresh address, including an acquisition module 501 and a processing module 502.

The acquisition module 501 is configured to obtain a current sampling address after a row hammer refresh signal arrives.

The processing module 502 is configured to determine whether a high address is locked in a current row hammer refresh cycle;
   in response to the high address being locked, determine whether a high address of the current sampling address is identical to the high address locked in the current row hammer refresh cycle;
   in response to the high address of the current sampling address being identical to the high address locked in the current row hammer refresh cycle, update an access frequency of the locked high address, and update access frequencies of low addresses with a low address of the current sampling address; and
   when a next row hammer refresh signal arrives, use a low address with a highest access frequency as a low address of the row hammer refresh address, and use the locked high address as a high address of the row hammer refresh address.

In some embodiments, the processing module 502 is further configured to:
   in response to the high address of the current sampling address being different from the locked high address, update access frequencies of high addresses with the high address of the current sampling address; and
   when it is determined that the next row hammer refresh signal does not arrive, obtain a next sampling address, and determine whether a high address of the next sampling address is identical to the high address locked in the current row hammer refresh cycle.

In some embodiments, the processing module 502 is further configured to:
   in response to the high address being not locked in the current row hammer refresh cycle, update the access frequencies of high addresses with the high address of the current sampling address; and
   determine whether there is a high address meeting a high-order frequency condition according to the access frequencies of the high addresses, and in response to there being a high address meeting the high-order frequency condition, lock the high address meeting the high-order frequency condition and initialize the access frequencies of the low addresses.

In some embodiments, the processing module 502 is further configured to:
   in response to there being no high address meeting the high-order frequency condition in high addresses recording access frequencies, obtain a next sampling address upon determining that the next row hammer refresh signal does not arrive, update the access frequencies of the high addresses with a high address of the next sampling address, and determine whether there is a high address meeting the high-order frequency condition according to the access frequencies of the high addresses.

In some embodiments, the high-order frequency condition includes:
   the access frequency of the high address is greater than or equal to a first frequency threshold.

In some embodiments, a semiconductor memory includes a group of low registers and a counter corresponding to each of the low registers.

The processing module 502 is further configured to:
   determine whether the low address of the current sampling address is stored in the group of low registers;
   in response to the low address of the current sampling address being stored, update the access frequency of the low address of the current sampling address;
   in response to the low address of the current sampling address being not stored, determine whether there is an idle low register in the group of low registers; and
   in response to there being an idle low register, store the low address of the current sampling address in the idle low register, and update the access frequency of the low address of the current sampling address.

In some embodiments, a semiconductor memory includes a group of high registers and a counter corresponding to each of the high registers.

The processing module 502 is further configured to:
   determine whether the high address of the current sampling address is stored in the group of high registers;
   in response to the high address of the current sampling address being stored, update an access frequency of the high address of the current sampling address;
   in response to the high address of the current sampling address being not stored, determine whether there is an idle high register in the group of high registers; and
   in response to there being an idle high register, store the high address of the current sampling address in the idle high register, and update the access frequency of the high address of the current sampling address.

In some embodiments, the processing module 502 is further configured to:
   in response to there being no idle high register in the group of high registers, determine whether a clearing condition is met, and in response to the clearing condition being met, determine whether a high address with a lowest access frequency is the locked high address; in response to the high address with the lowest access frequency being not the locked high address, delete address data in a high register where the high address with the lowest access frequency is located, and clear an access frequency corresponding to the high address with the lowest access frequency; and
   store the high address of the current sampling address in the high register where the address data is deleted, and update the access frequency of the high address of the current sampling address.

In some embodiments, the processing module 502 is further configured to:
   when row hammer refresh operations of the current row hammer refresh cycle are executed, delete address data in a high register where a high address with an access frequency less than a second frequency threshold is located, and clear an access frequency corresponding to the high address with the access frequency less than the second frequency threshold, here, the second frequency threshold is determined according to a number of executed row hammer refresh operations.

In some embodiments, the processing module 502 is further configured to:

after row hammer refresh operations of the current row hammer refresh cycle are completed, delete the low address of the row hammer refresh address stored in a group of low registers, clear an access frequency of the low address of the row hammer refresh address, and deduct the access frequency of the low address of the row hammer refresh address from an access frequency of the high address of the row hammer refresh address.

In some embodiments, the processing module 502 is further configured to:

after row hammer refresh operations of the current row hammer refresh cycle are completed, delete address data in a low register where a low address with an access frequency less than a third frequency threshold is located, clear an access frequency of the low address with the access frequency less than the third frequency threshold, and deduct a total access frequency of the low address with the access frequency less than the third frequency threshold from the access frequency of the high address locked in the current row hammer refresh cycle.

In some embodiments, the processing module 502 is further configured to:

after the next row hammer refresh signal arrives, in response to a high address with a highest access frequency being a high address locked in a last row hammer refresh cycle and an access frequency of the high address locked in the last row hammer refresh cycle meeting a high-order frequency condition, use the high address locked in the last row hammer refresh cycle as the high address locked in the current row hammer refresh cycle, and obtain a next sampling address; and after the next row hammer refresh signal arrives, in response to the high address with the highest access frequency being not the high address locked in the last row hammer refresh cycle and the high address with the highest access frequency meeting the high-order frequency condition, use the high address with the highest access frequency as the high address locked in the current row hammer refresh cycle, and obtain the next sampling address.

In some embodiments, the processing module 502 is further configured to:

after the next row hammer refresh signal arrives, in response to the high address with the highest access frequency being not the high address locked in the last row hammer refresh cycle and the high address with the highest access frequency not meeting the high-order frequency condition, obtain the next sampling address, update the access frequencies of the high addresses with a high address of the next sampling address, determine whether there is a high address meeting the high-order frequency condition according to the access frequencies of the high addresses, and in response to there being a high address meeting the high-order frequency condition, lock the high address meeting the high-order frequency condition and initialize the access frequencies of the low addresses.

An embodiment of the disclosure further provides a computer-readable storage medium, having stored thereon computer instructions that, when executed by a processor, implement the methods in the above embodiments.

An embodiment of the disclosure further provides a computer program product, including computer instructions that, when executed by a processor, implement the methods in the above embodiments.

According to the method and device for obtaining a row hammer refresh address provided in the disclosure, in each row hammer refresh cycle, the sampling address is divided into the high address and the low address; when it is determined that the high address is locked, it is determined whether the high address of the current sampling address is identical to the locked high address; and when the high address of the current sampling address is identical to the locked high address, access frequencies of low addresses are updated with the low address of the current sampling address. The high address with a high access frequency is locked at an early stage, and the access frequency of the low address is recorded based on the locked high address, therefore it may achieve by such configuration that it is unnecessary to record access frequencies of all sampling addresses, the required circuit structure is simple and consumes a relatively small area. Furthermore, by recording access frequencies of the high addresses and the low addresses, the row hammer refresh address is accurately captured and a risk of row hammer aggression is reduced.

After considering the descriptions and practicing the disclosure disclosed here, those skilled in the art will easily conceive of other embodiments of the disclosure. The disclosure is intended to cover any variants, usages or adaptive variations of the disclosure, and these variants, usages or adaptive variations follow general principles of the disclosure and include common knowledge or commonly used technical means in the technical field which are not disclosed in the disclosure. The descriptions and embodiments are only considered as exemplary, and the true scope and spirit of the disclosure are indicated by the attached claims.

It should be understood that the disclosure is not limited to the precise structure as described above and shown in the drawings, and various modifications and variations may be made without departing from the scope thereof. The scope of the disclosure is limited by the attached claims only.

The invention claimed is:

1. A method for obtaining a row hammer refresh address, comprising:

after a row hammer refresh signal arrives, obtaining a current sampling address, and determining whether a high address is locked in a current row hammer refresh cycle;

in response to the high address being locked, determining whether a high address of the current sampling address is identical to the high address locked in the current row hammer refresh cycle;

in response to the high address of the current sampling address being identical to the high address locked in the current row hammer refresh cycle, updating an access frequency of the locked high address, and updating access frequencies of low addresses stored in a group of low registers with a low address of the current sampling address, wherein each of the low addresses corresponds to a respective access frequency; and when a next row hammer refresh signal arrives, using a low address with a highest access frequency stored in the group of low registers as a low address of the row hammer refresh address, and using the locked high address as a high address of the row hammer refresh address.

2. The method of claim 1, further comprising:
in response to the high address of the current sampling address being different from the locked high address, updating access frequencies of high addresses stored in a group of high registers with the high address of the current sampling address, wherein each of the high addresses corresponds to a respective access frequency; and
obtaining a next sampling address upon determining that the next row hammer refresh signal does not arrive, and determining whether a high address of the next sampling address is identical to the high address locked in the current row hammer refresh cycle.

3. The method of claim 1, further comprising:
in response to no high address being locked in the current row hammer refresh cycle, updating access frequencies of high addresses stored in a group of high registers with the high address of the current sampling address, wherein each of the high addresses corresponds to a respective access frequency; and
determining whether a high address meeting a high-order frequency condition exists according to the access frequencies of the high addresses, and in response to existence of a high address meeting the high-order frequency condition, locking the high address meeting the high-order frequency condition and initializing the access frequencies of the low addresses.

4. The method of claim 3, further comprising:
in response to no existence of the high address meeting the high-order frequency condition in the high addresses recording the access frequencies, obtaining a next sampling address upon determining that the next row hammer refresh signal does not arrive, updating the access frequencies of the high addresses with a high address of the next sampling address, and determining whether a high address meeting the high-order frequency condition exists according to the access frequencies of the high addresses.

5. The method of claim 3, wherein the high-order frequency condition comprises:
an access frequency of a high address is greater than or equal to a first frequency threshold.

6. The method of claim 1, wherein a semiconductor memory comprises the group of low registers and a counter corresponding to each of the low registers,
updating the access frequencies of the low addresses with the low address of the current sampling address comprises:
determining whether the low address of the current sampling address is stored in the group of low registers;
in response to the low address of the current sampling address being stored, updating an access frequency of the low address of the current sampling address;
in response to the low address of the current sampling address being not stored, determining whether an idle low register exists in the group of low registers; and
in response to existence of the idle low register, storing the low address of the current sampling address in the idle low register, and updating the access frequency of the low address of the current sampling address.

7. The method of claim 2, wherein a semiconductor memory comprises the group of high registers and a counter corresponding to each of the high registers,
updating the access frequencies of the high addresses with the high address of the current sampling address comprises:
determining whether the high address of the current sampling address is stored in the group of high registers;
in response to the high address of the current sampling address being stored, updating an access frequency of the high address of the current sampling address;
in response to the high address of the current sampling address being not stored, determining whether an idle high register exists in the group of high registers; and
in response to existence of the idle high register, storing the high address of the current sampling address in the idle high register, and updating the access frequency of the high address of the current sampling address.

8. The method of claim 7, wherein updating the access frequencies of the high addresses with the high address of the current sampling address further comprises:
in response to no existence of the idle high register in the group of high registers, determining whether a clearing condition is met, and in response to the clearing condition being met, determining whether a high address with a lowest access frequency stored in the group of high registers is the locked high address; in response to the high address with the lowest access frequency being not the locked high address, deleting address data in a high register where the high address with the lowest access frequency is located, and clearing an access frequency corresponding to the high address with the lowest access frequency; and
storing the high address of the current sampling address in the high register where the address data is deleted, and updating the access frequency of the high address of the current sampling address.

9. The method of claim 1, further comprising:
when row hammer refresh operations of the current row hammer refresh cycle are executed, deleting address data in a high register where a high address with an access frequency less than a second frequency threshold is located, and clearing an access frequency corresponding to the high address with the access frequency less than the second frequency threshold, wherein the second frequency threshold is positively correlated with a number of executed row hammer refresh operations.

10. The method of claim 1, further comprising:
after row hammer refresh operations of the current row hammer refresh cycle are completed, deleting the low address of the row hammer refresh address stored in the group of low registers, clearing an access frequency of the low address of the row hammer refresh address, and deducting the access frequency of the low address of the row hammer refresh address from an access frequency of the high address of the row hammer refresh address.

11. The method of claim 1, further comprising:
after row hammer refresh operations of the current row hammer refresh cycle are completed,
for each low address with an access frequency less than a third frequency threshold, deleting address data in a low register where the low address is located, clearing an access frequency of the low address; and
deducting a total access frequency of all of the each low address from the access frequency of the high address locked in the current row hammer refresh cycle.

12. The method of claim 1, further comprising:
after the next row hammer refresh signal arrives, in response to a high address with a highest access frequency stored in a group of high registers being a high address locked in a last row hammer refresh cycle and an access frequency of the high address locked in the last row hammer refresh cycle meeting a high-order frequency condition, using the high address locked in the last row hammer refresh cycle as the high address locked in the current row hammer refresh cycle, and obtaining a next sampling address; and after the next row hammer refresh signal arrives, in response to the high address with the highest access frequency being not the high address locked in the last row hammer refresh cycle and the high address with the highest access frequency meeting the high-order frequency condition, using the high address with the highest access frequency as the high address locked in the current row hammer refresh cycle, and obtaining the next sampling address.

13. The method of claim 12, further comprising:

after the next row hammer refresh signal arrives, in response to the high address with the highest access frequency being not the high address locked in the last row hammer refresh cycle and the high address with the highest access frequency not meeting the high-order frequency condition, obtaining the next sampling address, and updating access frequencies of high addresses stored in the group of high registers with a high address of the next sampling address, wherein each of the high addresses corresponds to a respective access frequency; determining whether a high address meeting the high-order frequency condition exists according to the access frequencies of the high addresses, and in response to existence of a high address meeting the high-order frequency condition, locking the high address meeting the high-order frequency condition and initializing the access frequencies of the low addresses.

14. A control device for obtaining a row hammer refresh address, comprising:
   a processor, and
   a memory storing a computer program executable by the processor,
   wherein the processor is configured to perform operations of:
      after a row hammer refresh signal arrives, obtaining a current sampling address, and determining whether a high address is locked in a current row hammer refresh cycle;
      in response to the high address being locked, determining whether a high address of the current sampling address is identical to the high address locked in the current row hammer refresh cycle;
      in response to the high address of the current sampling address being identical to the high address locked in the current row hammer refresh cycle, updating an access frequency of the locked high address, and updating access frequencies of low addresses stored in a group of low registers with a low address of the current sampling address, wherein each of the low addresses corresponds to a respective access frequency; and
      when a next row hammer refresh signal arrives, using a low address with a highest access frequency stored in the group of low registers as a low address of the row hammer refresh address, and using the locked high address as a high address of the row hammer refresh address.

15. The control device of claim 14, wherein the processor is further configured to perform operations of:
   in response to the high address of the current sampling address being different from the locked high address, updating access frequencies of high addresses stored in a group of high registers with the high address of the current sampling address, wherein each of the high addresses corresponds to a respective access frequency; and
   obtaining a next sampling address upon determining that the next row hammer refresh signal does not arrive, and determining whether a high address of the next sampling address is identical to the high address locked in the current row hammer refresh cycle.

16. The control device of claim 14, wherein the processor is further configured to perform operations of:
   in response to no high address being locked in the current row hammer refresh cycle, updating access frequencies of high addresses stored in a group of high registers with the high address of the current sampling address, wherein each of the high addresses corresponds to a respective access frequency; and
   determining whether a high address meeting a high-order frequency condition exists according to the access frequencies of the high addresses, and in response to existence of a high address meeting the high-order frequency condition, locking the high address meeting the high-order frequency condition and initializing the access frequencies of the low addresses.

17. The control device of claim 16, wherein the processor is further configured to perform operations of:
   in response to no existence of the high address meeting the high-order frequency condition in the high addresses recording the access frequencies, obtaining a next sampling address upon determining that the next row hammer refresh signal does not arrive, updating the access frequencies of the high addresses with a high address of the next sampling address, and determining whether a high address meeting the high-order frequency condition exists according to the access frequencies of the high addresses.

18. The control device of claim 16, wherein the high-order frequency condition comprises:
   an access frequency of a high address is greater than or equal to a first frequency threshold.

19. The control device of claim 14, wherein a semiconductor memory comprises the group of low registers and a counter corresponding to each of the low registers,
   updating the access frequencies of the low addresses with the low address of the current sampling address comprises:
   determining whether the low address of the current sampling address is stored in the group of low registers;
   in response to the low address of the current sampling address being stored, updating an access frequency of the low address of the current sampling address;
   in response to the low address of the current sampling address being not stored, determining whether an idle low register exists in the group of low registers; and
   in response to existence of the idle low register, storing the low address of the current sampling address in the idle low register, and updating the access frequency of the low address of the current sampling address.

20. A non-transitory computer-readable storage medium having stored thereon computer executable instructions that, when executed by a processor, cause the processor to perform operations of:

after a row hammer refresh signal arrives, obtaining a current sampling address, and determining whether a high address is locked in a current row hammer refresh cycle;

in response to the high address being locked, determining whether a high address of the current sampling address is identical to the high address locked in the current row hammer refresh cycle;

in response to the high address of the current sampling address being identical to the high address locked in the current row hammer refresh cycle, updating an access frequency of the locked high address, and updating access frequencies of low addresses stored in a group of low registers with a low address of the current sampling address, wherein each of the low addresses corresponds to a respective access frequency; and when a next row hammer refresh signal arrives, using a low address with a highest access frequency stored in the group of low registers as a low address of the row hammer refresh address, and using the locked high address as a high address of the row hammer refresh address.

\* \* \* \* \*